(12) United States Patent
Yeh et al.

(10) Patent No.: US 8,405,155 B2
(45) Date of Patent: Mar. 26, 2013

(54) SEMICONDUCTOR STRUCTURE WITH GATE STRUCTURE, SOURCE/DRAIN REGION AND RECESS FILLING WITH EPITAXIAL LAYER

(75) Inventors: Chiu-Hsien Yeh, Tainan (TW); Chun-Yuan Wu, Yunlin County (TW); Chin-Cheng Chien, Tainan County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 141 days.

(21) Appl. No.: 12/888,430

(22) Filed: Sep. 23, 2010

(65) Prior Publication Data

US 2012/0074468 A1   Mar. 29, 2012

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. .................. 257/369; 257/382; 257/E27.06; 257/E27.062

(58) Field of Classification Search .................. 257/369, 257/382, 408, E27.06, E27.062
See application file for complete search history.

(56) References Cited

U.S. PATENT DOCUMENTS

| | | | |
|---|---|---|---|
| 6,946,350 B2 | 9/2005 | Lindert | |
| 7,335,959 B2 | 2/2008 | Curello | |
| 7,560,758 B2 | 7/2009 | Zhu | |
| 2006/0115949 A1 | 6/2006 | Zhang | |
| 2006/0138398 A1* | 6/2006 | Shimamune et al. | ........... 257/19 |

* cited by examiner

*Primary Examiner* — Hoai V Pham
(74) *Attorney, Agent, or Firm* — Winston Hsu; Scott Margo

(57) ABSTRACT

A semiconductor structure comprises a substrate, a gate structure, at least a source/drain region, a recess and an epitaxial layer. The substrate includes an up surface. A gate structure is located on the upper surface. The source/drain region is located within the substrate beside the gate structure. The recess is located within the source/drain region. The epitaxial layer fills the recess, and the cross-sectional profile of the epitaxial layer is an octagon.

12 Claims, 4 Drawing Sheets

US 8,405,155 B2

SEMICONDUCTOR STRUCTURE WITH GATE STRUCTURE, SOURCE/DRAIN REGION AND RECESS FILLING WITH EPITAXIAL LAYER

BACKGROUND OF THE INVENTION

1. Field of the Invention

The present invention relates to a semiconductor structure, and more particularly, to a semiconductor structure having an epitaxial layer filling a recess, in which the cross-sectional profile of the epitaxial layer is an octagon.

2. Description of the Prior Art

For decades, chip manufacturers have made metal-oxide-semiconductor (MOS) transistors faster by making them smaller. As the semiconductor processes advance to very deep sub micron era such as 65-nm node or beyond, how to increase the driving current for MOS transistors has become a critical issue.

In order to improve device performance, crystal strain technology has been developed. Crystal strain technology is becoming more and more attractive as a means for getting better performance in the field of CMOS transistor fabrication. Putting a strain on a semiconductor crystal alters the speed at which charges move through that crystal. Strain makes CMOS transistors work better by enabling electrical charges, such as electrons, to pass more easily through the silicon lattice of the gate channel.

FIG. 1 is a schematic, cross-sectional diagram illustrating a semiconductor structure applying epitaxy technology in accordance with prior art. As shown in FIG. 1, the semiconductor structure 10 includes a substrate 12, a gate structure 14, a source/drain region 16, two recesses 18 and an epitaxial layer 19. The gate structure 14 includes a gate dielectric layer 14a, a gate electrode 14b, a spacer 14c and a capping layer 14d. The source/drain region 16 and the recess 18 are formed within the substrate 12 adjacent to two sides of the spacer 14c, and a gate channel 20 is formed beneath the gate structure 14 and between the recess 18 to electrically connect the source/drain region 16. The compressive stress or the tensile stress caused by the epitaxial layer 19 is generated on either side of the gate channel 20, thereby increasing the electron or hole mobility in the gate channel 20.

In general, the shape, the size and the relative position of the recess 18 must be formed as shown in FIG. 1 to achieve electrical mobility in the gate channel 20, in which the recess 18 is a diamond shaped structure having a plurality of the slanted sidewalls, and the compressive stress or the tensile stress generated on either side of the gate channel 20 caused by filling the epitaxial layer 19 will increase the electrical or hole mobility of the gate channel 20. However, the process will oblige the gate channel 20 so narrow that the gate structure 14 may collapse and the short channel effect will cause circuit leakages. Moreover, applying the prior art approach (as shown in FIG. 1) to etch the recess 18, the sidewalls of the recess 18 will have an angle A1 pointing to the gate channel 20, and the angle A1 may cause a point discharge and give rise to circuit leakages caused by the short channel effect. Also, the angle A1 beneath the gate structure 14 may easily result in the gate structure 14 collapse because of the stress concentration. Moreover, because the lower part of the recess 18 appears as a V-shaped profile, the angle A2 of the bottom of the recess 18 may also result in circuit leakages.

SUMMARY OF THE INVENTION

It is an objective of the present invention to provide a semiconductor structure having an epitaxial layer with an octagon-shaped cross-sectional profile filling a recess for solving circuit leakages resulted from the short channel effect and structure collapse caused by stress concentration.

According to a preferred embodiment of the present invention, a semiconductor structure comprises: a substrate, a gate structure, at least a source/drain region, a recess and an epitaxial layer. The substrate includes an up surface. The gate structure is located on the up surface. The source/drain region is located beside the gate structure within the substrate. The recess is located within the source/drain region. The epitaxial layer of the octagon shaped cross-sectional profile fills the recess.

According to another preferred embodiment of the present invention, a semiconductor structure comprises: a substrate, a gate structure, at least a source/drain region, a first recess and an epitaxial layer. The substrate includes an up surface. The gate structure is located on the up surface. The source/drain region is located beside the gate structure within the substrate. The first recess is located within the source/drain region and the first recess has a vertical sidewall, a slanted sidewall and a flat-bottomed surface. The epitaxial layer fills the first recess.

These and other objectives of the present invention will no doubt become obvious to those of ordinary skill in the art after reading the following detailed description of the preferred embodiment that is illustrated in the various figures and drawings.

DETAILED DESCRIPTION

Figure 2:
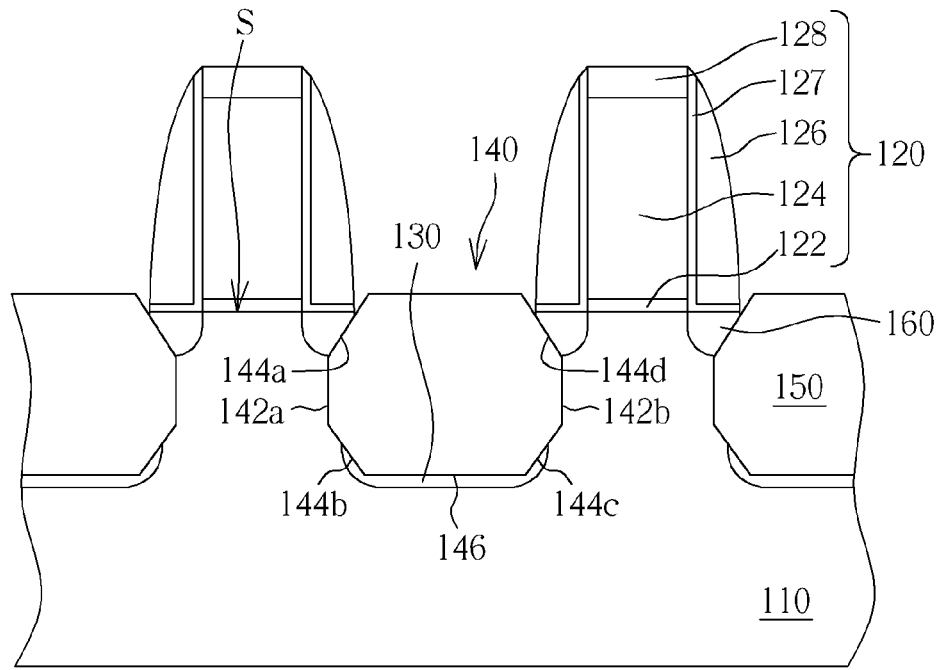
FIG. 2 is a schematic, cross-sectional diagram illustrating a semiconductor structure applying epitaxy technology in accordance with one preferred embodiment of the present invention.

FIG. 2 is a schematic, cross-sectional diagram illustrating a semiconductor structure applying epitaxy technology in accordance with a preferred embodiment of the present invention. As shown in FIG. 2, a semiconductor structure 100 includes a substrate 110, a gate structure 120, a source/drain region 130, a recess 140 and an epitaxial layer 150. The substrate 110 includes an up surface S, and the gate structure 120 is disposed on the up surface S. The gate structure 120 includes a gate dielectric layer 122, a gate electrode 124, a spacer 126, an L-shaped liner 127 and a capping layer 128. The gate electrode 124 is located on the gate dielectric layer 122, and the capping layer 128 covers the gate electrode 124 for being a hard mask in the subsequently performed lithography process, ion implantation process or etch process to prevent the gate electrode 124 from damages in processes.

Furthermore, the spacer 126 is disposed on both side of the gate dielectric layer 122 and the gate electrode 124. The use of the spacer 126 is similar to the capping layer 128, in which the spacer 126 can be a hard mask in subsequent processes and can define the position of the source/drain region 130 such that the source/drain region 130 is located within the substrate 110 beside the gate structure 120.

In this embodiment, the fabricating method of the gate structure 120 includes performing a thermal or depositing process to comprehensively form a dielectric material layer (not shown) on the substrate 110, and then, depositing a conductive layer (not shown) and a capping material layer (not shown) sequentially on the dielectric material layer. Thereafter, a pattern transfer process is performed to form the gate dielectric layer 122, a gate electrode 124, and a capping layer 128 by using a patterned photoresist, but not limited thereto. After that, the spacer 126 may be formed by etch process and the source/drain region 130 may be formed after the spacer 126 by an ion implantation process. Optionally, a lightly doped source/drain region 160 may be formed before the spacer 126. In addition to the above approach and sequence, it is known that the order for forming the gate structure 120, the spacers 126, the lightly doped source/drain region 160 and the source/drain region 130 could all be adjusted according to the demand of the product, which are all within the scope of the present invention.

In one embodiment, the gate dielectric layer 122 may be composed of silicon dioxide, silicon nitride, silicon oxynitride, a metal oxide compound, or other suitable high dielectric constant material. The material of the gate electrode 124 may be a heavily doped polycrystalline silicon, a metal or metal alloy such as titanium, tantalum, titanium nitride, tantalum nitride, tungsten or combinations of the above. The material of the capping layer 126 may be silicon nitride. The spacer 126 may be a silicon nitride layer, and the spacer 126 may be a multiple structure including an interior spacer and an outer spacer (no shown). The epitaxial layer 150 may include a silicon germanium layer or a silicon carbide layer.

Furthermore, the recess 140 is located within the source/drain region 130, the epitaxial layer 150 may fill the recess 140 by an selective epitaxial growth, SEG, wherein the epitaxial layer 150 grows along the surface of the recess 140 and slightly protruding from the up surface S of the substrate 110. In this embodiment, the shape of the epitaxial layer 150 is a regular octagon. The recess 140 includes two vertical sidewalls 142a, 142b, four slanted sidewalls 144a, 144b, 144c, 144d and a flat-bottomed surface 146. The slanted sidewalls 144a and 144d respectively connect the up surface S and the vertical sidewalls 142a and 142b. The slanted sidewalls 144b and 144c respectively connect the vertical sidewalls 142a and 142b and the flat-bottomed surface 146. In one preferred embodiment, the flat-bottomed surface 146 is parallel to the up surface S. The vertical sidewall 142a is parallel to the vertical sidewall 142b and both of the vertical sidewalls 142a, 142b are perpendicular to the up surface S and the flat-bottomed surface 146. The slanted sidewall 144a is parallel to the slanted sidewall 144c and the slanted sidewall 144b is parallel to the slanted sidewall 144d. The substrate 110 may be a bulk or a single crystalline silicon, and the epitaxial layer 150 may include a silicon germanium layer or a silicon carbide layer. In the embodiment, the crystal surface of the substrate 110 of the single crystalline silicon is composed of the <100> planes, the <110> planes, and the <111> planes of the silicon. The up surface S is oriented along the <100> planes, and the slanted sidewall of the recess 140 is formed along the <111> planes.

Or, the up surface S is oriented along the <110> planes, and the slanted sidewall of the recess 140 is formed along the <111> planes.

Figure 3:
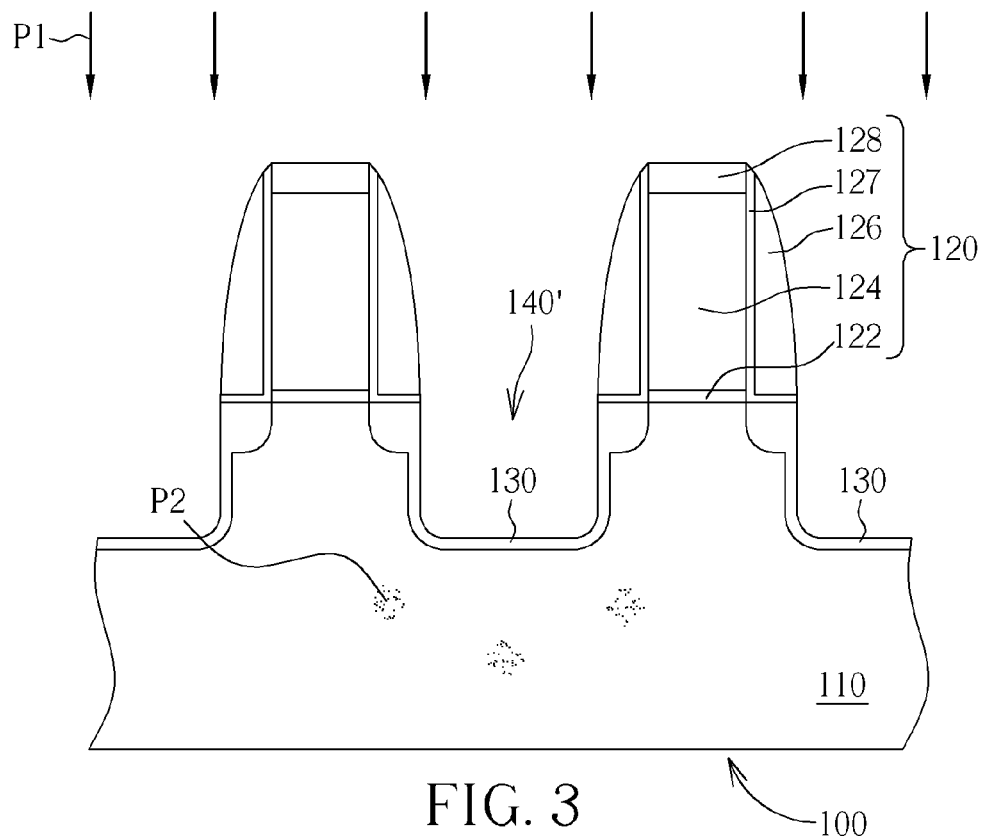
FIGS. 3-4 are schematic, cross-sectional diagrams illustrating a semiconductor process applying epitaxy technology in accordance with FIG. 2.
Figure 4:
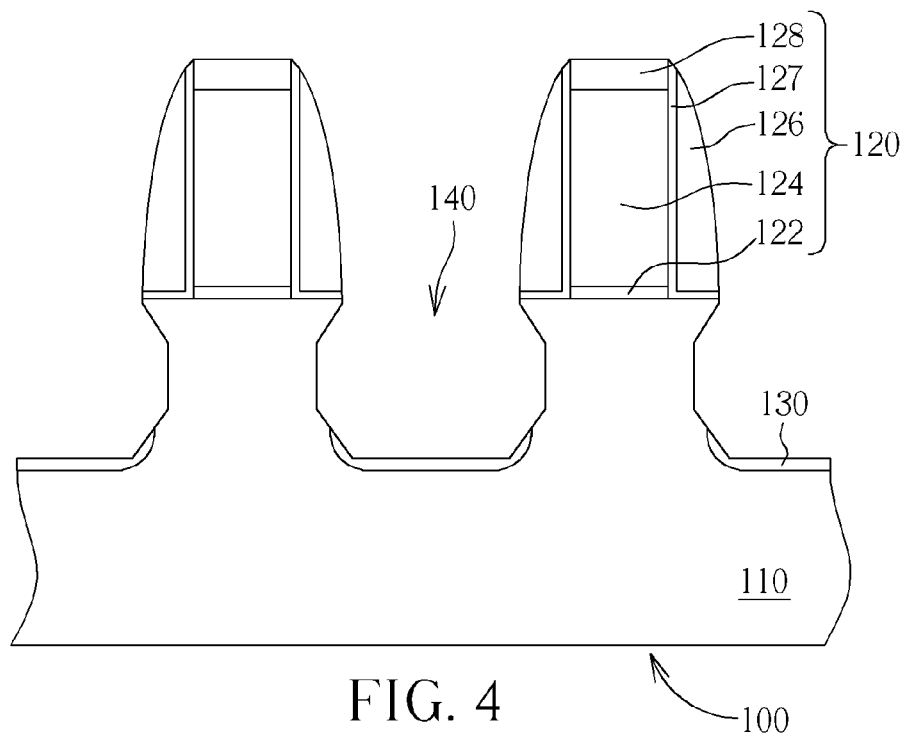

Moreover, the cross-sectional profile of the epitaxial layer 150 having the octagon structure is dependent on the shape of the recess 140. The forming steps of the recess 140 is shown in FIG. 3.-FIG. 4, in which FIGS. 3-4 are schematic, cross-sectional diagrams illustrating a semiconductor process applying epitaxy technology in accordance with FIG. 2. As shown in FIG. 3-FIG. 4, an etch process P1 is performed to etch the source/drain region 130 to a predetermined depth 140'. Then, an adjustment process is performed according to the shape of the recess 140. For example, an adjustment process may be an ion implantation process P2, (as shown in FIG. 3). Thereafter, a wet etch process is performed to form the desired recess 140 by the different etching rate of the crystal plane of the substrate 110 (as shown in FIG. 4). In a preferred embodiment, the wet etch process using $HF/NH_4OH$ as an etchant, but the present invention is not limited thereto. In other embodiments, a wet etch process or multiple wet etch processes are performed to form the desired recess 140 by selecting the etchants, including ammonia-based etching solutions, tetramethl ammonia hydroxide (TMAH)-based etching solutions, hydroxide-based etching solutions, ethylene diamine pyrocatechol (EDP)-based etching solutions, etc.

It should be noted that the recess 140 has a vertical sidewall 142, which can solve circuit leakages resulting from point discharge caused by the point angle A1, A2 of the prior art (shown in FIG. 1) to improve the electrical quality of the semiconductor structure 100. Moreover, the vertical sidewall 142 can significantly reduce collapse of the gate structure 14 caused by stress concentration of the point angle A1 of the prior art's sidewalls, thereby increasing the stability and the durability of the semiconductor structure 100.

Figure 1:
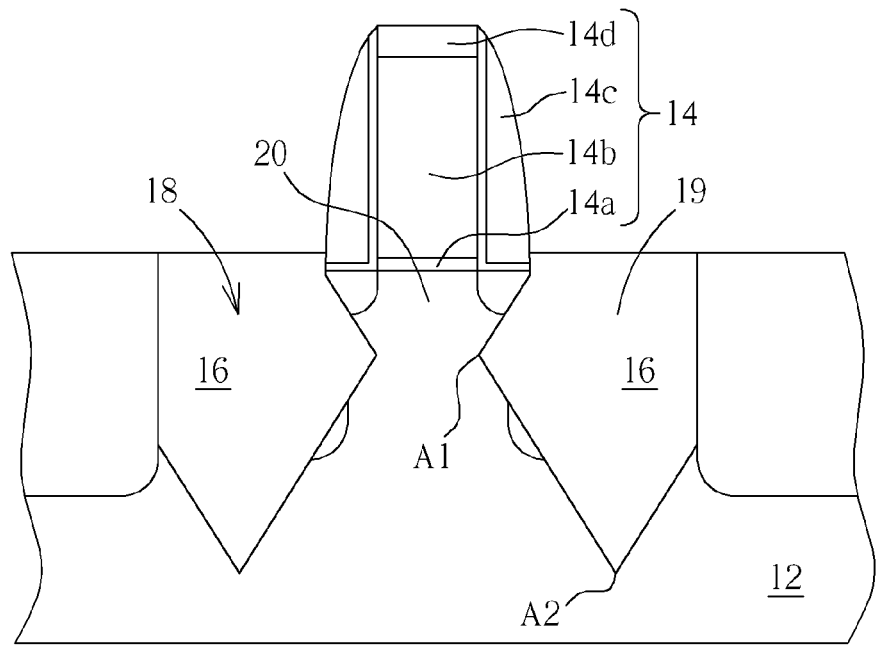
FIG. 1 is a schematic, cross-sectional diagram illustrating a semiconductor structure applying epitaxy technology in accordance with prior art.
Figure 5:
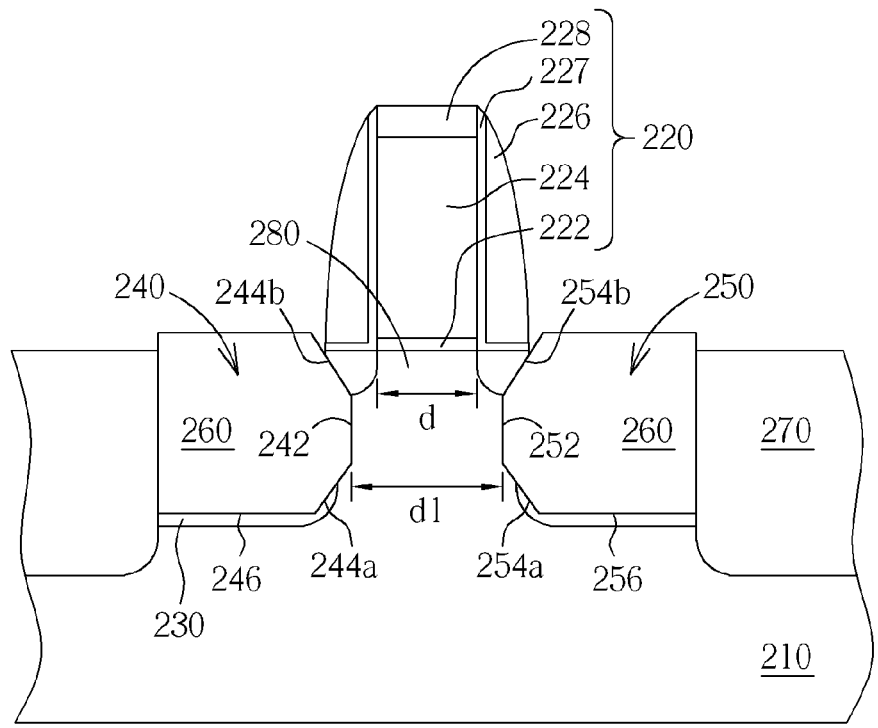
FIG. 5 is a schematic, cross-sectional diagram illustrating a semiconductor structure applying epitaxy technology in accordance with another preferred embodiment of the present invention.

In addition to the structure shown in FIG. 1, the present invention also can be used in the structure shown in FIG. 5, in which FIG. 5 is a schematic, cross-sectional diagram illustrating a semiconductor structure applying epitaxy technology in accordance with another preferred embodiment of the present invention. Likewise, the present invention also can be used in other structures, which can solve circuit leakages resulted from the point discharges by etching vertical sidewalls.

As shown in FIG. 5, the semiconductor structure 200, similar to the semiconductor structure 100, includes a substrate 210, a gate structure 220, a source/drain region 230 and an epitaxial layer 260. The gate structure 220 from down to up includes a gate dielectric layer 222, a gate electrode 224, a capping layer 228, and a spacer 226 and an L-shaped liner 227 surrounding the gate structure 220. Compared with the embodiment of FIG. 2, which discloses a semiconductor having a common source/drain region, the semiconductor structure 200 disclosed in FIG. 5 is a single component structure. For example, the semiconductor structure 200 may be a MOS transistor having an insulating isolation 270 and a first recess 240 and a second recess 250 located on both sides of the gate structure 220. Each of the first recess 240 and the second recess 250 has a vertical sidewall 242,252, two slanted sidewalls 244a, 244b, 254a, 254b and a flat-bottomed surface 246,256. The gate channel 280 is located within the substrate 210 beneath the gate structure 220 and between the slanted sidewall 244b of the first recess 240 and the slanted sidewall 254b of the second recess 250. The compressive or tensile stress generated from both sides of the gate channel 280 forced by the epitaxial layer 280 filling-in thereafter can increase the electron or hole mobility of the gate channel 20.

In addition, the semiconductor structure 210 further includes an insulating isolation 270 located the substrate 210 to provide an insulation between adjacent devices or transistors (not shown). Thus, the first recess 240 and the second recess 250 respectively having the vertical sidewall 242,252 can prevent structure collapse and circuit leakages mentioned above.

In a preferred embodiment, the vertical sidewalls 242,252 can further be disposed beneath the spacer 226, therefore the distance d1 between the vertical sidewall 242 of the first recess 240 and the vertical sidewall 252 of the second recess 250 is longer than the length d of the gate dielectric layer 222. In other words, the distance d1 is longer than the distance d of the gate channel 280. In addition, the vertical sidewall 242 of the first recess 240 and the vertical sidewall 252 of the second recess 250 may be located beneath the gate dielectric layer 222. Thus, the epitaxial layer 260 filled in the first recess 240 and the second recess 250 can induce a crystal dislocation of the substrate 210 and force the compressive or tensile stress on both sides of the gate channel 280 by the slanted sidewalls 244b, 254b connecting the vertical sidewalls 242, 252, to increase the electron or hole mobility of the gate channel 280. Likewise, the epitaxial layer 260 may be a silicon germanium layer or a silicon carbide layer dependent on the property of the p-typed MOS transistor or the n-typed MOS transistor.

Figure 6:
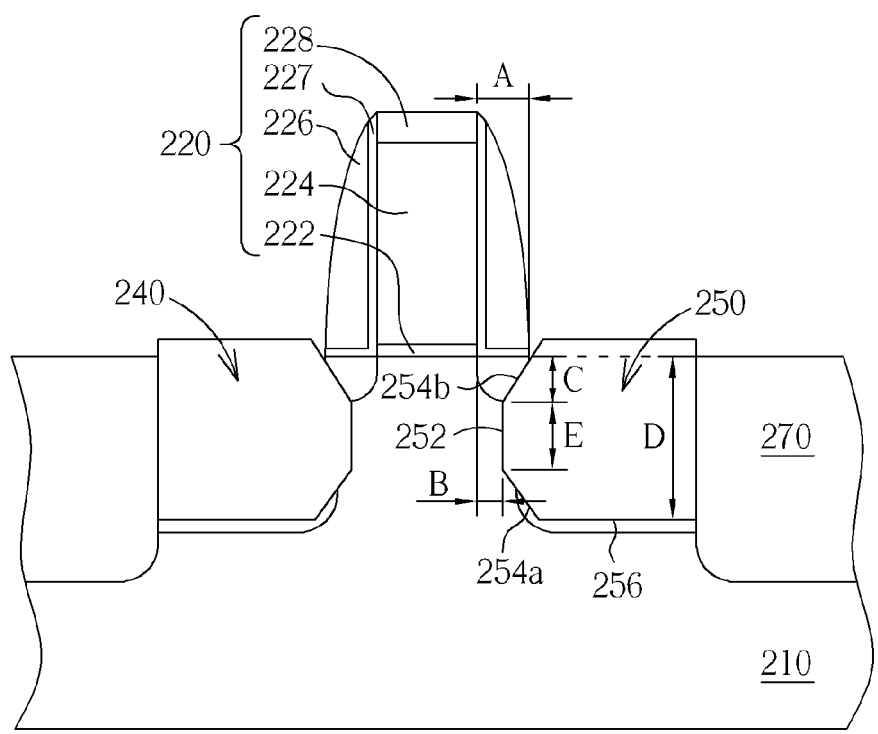
FIG. 6 is a schematic diagram of the relative position and size of the recess in the present invention.

Please refer to FIG. 6, illustrating the schematic diagram of the relative position and size of the recess in the present invention, in which FIG. 6 is illustrated according to the embodiment in FIG. 5. As shown in FIG. 6, distance A refers to the distance between the sidewall of the gate electrode 224 and the second recess 250 (or the epitaxial layer 260) along the up surface S, and distance A is about 130±A. Distance B refers to the horizontal distance between the sidewall of the gate electrode 224 and the vertical sidewall 252, and distance B is about 20±A. Distance C refers to the vertical distance between the top of the vertical sidewall 252 and the up surface S, and distance C is about 100±25 A. Distance D refers to the vertical distance between the flat-bottomed surface 256 and the up surface S, and distance D is about 650±A. Distance E refers to the depth of the vertical sidewall 252, and distance E is about 200±25 A. It is understood for one of ordinary skills in the art that the above-mentioned relative position and size of the recess can refer to the recess 140, the first recess 240 and the second recess 250. However, the above-mentioned relative position and size is not limited thereto.

Figure 7:
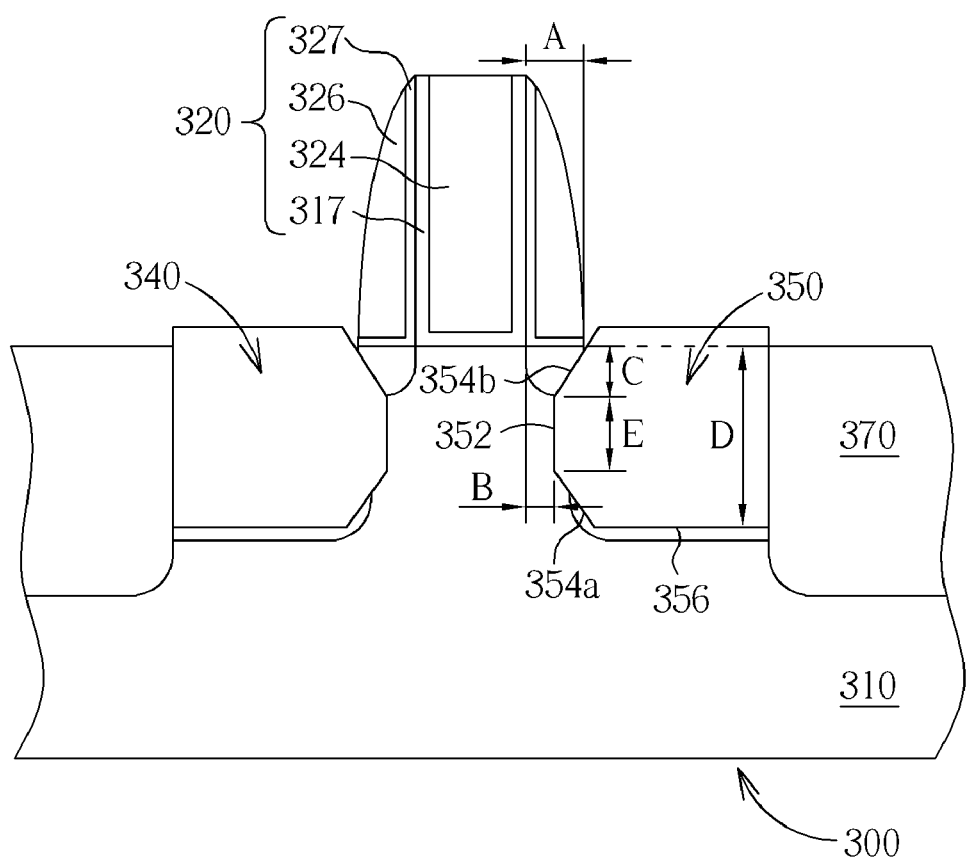
FIG. 7 is a schematic diagram of the relative position and size of the recess in the present invention in accordance with another preferred embodiment of the present invention.

In another embodiment as shown in FIG. 7, the semiconductor structure 300, similar to the semiconductor structure 200, includes a substrate 310, a gate structure 320, a source/drain region 330 and an epitaxial layer 360. The gate structure 320 from down to up includes a gate dielectric layer 322, a gate electrode 324, a capping layer 328, and a spacer 326 and an L-shaped liner 327 surrounding the gate structure 320. Compared with the embodiment of FIG. 6, the gate electrode 324 is a metal gate. The gate dielectric layer 322 is a U-shaped dielectric layer. The gate dielectric layer 322 is disposed between the L-shaped liner 327 and the gate electrode 324, and is also disposed between the substrate 302 and the gate electrode 324. The gate dielectric layer 322 includes high-k dielectric material, such as HfSiNO or $ZrO_2$, but is not limited thereto. Other components in the semiconductor structure 300 are similar to the semiconductor structure 200 and are not described repeatedly.

As shown in FIG. 7, distance A refers to the distance between the sidewall of the U-shaped gate dielectric layer 322 and the second recess 350 (or the epitaxial layer 360) along the up surface S, and distance A is about 130±A. Distance B refers to the horizontal distance between the sidewall of the U-shaped gate dielectric layer 322 and the vertical sidewall 352, and distance B is about 20±A. Distance C refers to the vertical distance between the top of the vertical sidewall 352 and the up surface S, and distance C is about 100±25 A. Distance D refers to the vertical distance between the flat-bottomed surface 356 and the up surface S, and distance D is about 650±A. Distance E refers to the depth of the vertical sidewall 352, and distance E is about 200±25 A. It is understood for one of ordinary skills in the art that the above-mentioned relative position and size is not limited thereto.

Overall, the present invention provides a semiconductor structure, the recess of which urges the epitaxial layer to be formed in an octagon-shaped cross-sectional profile or the recess of which has a vertical sidewall. The vertical sidewalls of the octagon-shaped profile or the vertical sidewall of the recess can reduce the stress concentration beneath the gate structure to prevent structure from collapse. Moreover, the vertical sidewalls also can prevent circuit leakages caused by the point discharge because of the charge concentration in either side of the gate channel.

Those skilled in the art will readily observe that numerous modifications and alterations of the device and method may be made while retaining the teachings of the invention.

What is claimed is:

1. A semiconductor structure, comprising:
   a substrate, including an up surface;
   a gate structure, located on the up surface;
   at least a source/drain region, located within the substrate beside the gate structure;
   a first recess located within the source/drain region, wherein the first recess at least has a vertical sidewall, a slanted sidewall and a flat-bottomed surface, wherein the vertical sidewall is disposed directly under the gate structure; and
   an epitaxial layer filling the first recess.

2. The semiconductor structure of claim 1, wherein the flat-bottomed is parallel to the up surface.

3. The semiconductor structure of claim 1, wherein the substrate includes a single crystalline silicon, and the crystal planes of the substrate is composed of the <100> planes, the <110> planes, and the <111> planes of the silicon.

4. The semiconductor structure of claim 3, wherein the up surface is oriented along the <100> planes, and the slanted sidewall is along the <111> planes.

5. The semiconductor structure of claim 3, wherein the up surface is oriented along the <110> planes, and the slanted sidewall is along the <111> planes.

6. The semiconductor structure of claim 1, wherein the gate structure comprises a gate dielectric layer, a gate electrode located on the gate dielectric layer, and a spacer surrounding the gate electrode and the gate dielectric layer.

7. The semiconductor structure of claim 6, wherein the vertical sidewall is located beneath the gate dielectric layer.

8. The semiconductor structure of claim 6, wherein the vertical sidewall is located beneath the spacer.

9. The semiconductor structure of claim 1, further comprising a second recess located within the substrate and on the side of the gate structure opposite to the first recess.

10. The semiconductor structure of claim 9, wherein a vertical sidewall of the second recess is located beneath the gate structure.

11. The semiconductor structure of claim 10, further comprising a gate channel within the substrate beneath the gate structure and between the slanted sidewall of the first recess and a slanted sidewall of the second recess.

12. The semiconductor structure of claim 1, wherein top of the vertical sidewall is lower than the up surface of the substrate.

* * * * *